(12) United States Patent
Kwon et al.

(10) Patent No.: US 9,793,516 B2
(45) Date of Patent: Oct. 17, 2017

(54) LIGHT EXTRACTION SUBSTRATE FOR ORGANIC LIGHT-EMITTING ELEMENT, METHOD FOR MANUFACTURING SAME AND ORGANIC LIGHT-EMITTING ELEMENT INCLUDING SAME

(71) Applicant: Corning Precision Materials Co., Ltd., Chungcheongnam-do (KR)

(72) Inventors: Yoon Young Kwon, Chungcheongnam-do (KR); Kyoung Wook Park, Chungcheongnam-do (KR); Jeong Woo Park, Chungcheongnam-do (KR)

(73) Assignee: Corning Precision Materials Co., Ltd. (KR)

( * ) Notice: Subject to any disclaimer, the term of this patent is extended or adjusted under 35 U.S.C. 154(b) by 0 days.

(21) Appl. No.: 14/902,773

(22) PCT Filed: Jul. 2, 2014

(86) PCT No.: PCT/KR2014/005910
§ 371 (c)(1),
(2) Date: Jan. 4, 2016

(87) PCT Pub. No.: WO2015/002463
PCT Pub. Date: Jan. 8, 2015

(65) Prior Publication Data
US 2016/0172632 A1      Jun. 16, 2016

(30) Foreign Application Priority Data
Jul. 3, 2013   (KR) .................. 10-2013-0077784

(51) Int. Cl.
*H01L 51/52*   (2006.01)
*H01L 51/00*   (2006.01)
(Continued)

(52) U.S. Cl.
CPC ........ *H01L 51/5275* (2013.01); *G02B 5/0247* (2013.01); *H01L 51/0096* (2013.01);
(Continued)

(58) Field of Classification Search
CPC . H01L 51/0096; H01L 51/56; H01L 51/5275; H01L 2251/558; Y02E 10/549; G02B 5/0247

See application file for complete search history.

(56) References Cited

U.S. PATENT DOCUMENTS

2009/0295284 A1* 12/2009 Park .................. H01L 51/5275
                                                    313/504
2011/0151607 A1*  6/2011 Landis ............... H01L 51/0023
                                                    438/46
(Continued)

FOREIGN PATENT DOCUMENTS

JP        2010-123322 A     6/2010
KR   10-2012-0000402 A     1/2012
(Continued)

OTHER PUBLICATIONS

International Search Report for Application No. PCT/KR2014/005910 dated Aug. 25, 2014.

*Primary Examiner* — Caridad Everhart
(74) *Attorney, Agent, or Firm* — Lerner, David, Littenberg, Krumholz & Mentlik, LLP

(57) ABSTRACT

The present invention relates to a light extraction substrate for an organic light-emitting element, a method for manufacturing the same and an organic light-emitting element including the same, which can shed its dependence on light extraction in a specific wavelength range appearing in a light determining pattern of a cyclical form and induce light extraction in a broader wavelength range. To this end, the present invention relates to a light extraction substrate for an organic light-emitting element, a method for manufacturing
(Continued)

the same and an organic light-emitting element including the same. The light extraction substrate is disposed on one surface through which light emitted from the organic light-emitting element is outwardly released and comprises: a base substrate; a light determining pattern formed on the base substrate; and a leveling layer formed on the light determining pattern and having a surface contacting the organic light-emitting element, wherein a plurality of air voids having a random shape and size are irregularly distributed on an interface between the light determining pattern and the leveling layer.

15 Claims, 3 Drawing Sheets

(51) Int. Cl.
  *H01L 51/56* (2006.01)
  *G02B 5/02* (2006.01)
(52) U.S. Cl.
  CPC ........ *H01L 51/56* (2013.01); *H01L 2251/558* (2013.01); *Y02E 10/549* (2013.01)

(56) References Cited

U.S. PATENT DOCUMENTS

| | | | |
|---|---|---|---|
| 2011/0234944 A1* | 9/2011 | Powers | C09K 19/544 349/86 |
| 2012/0018758 A1* | 1/2012 | Matioli | B82Y 20/00 257/98 |
| 2012/0234460 A1* | 9/2012 | Zhang | H01L 51/5268 156/67 |
| 2012/0305966 A1 | 12/2012 | Shin | |
| 2013/0075693 A1* | 3/2013 | Svensson | H01L 29/0676 257/13 |
| 2014/0014923 A1 | 1/2014 | Jang et al. | |

FOREIGN PATENT DOCUMENTS

| KR | 10-2012-0024510 A | 3/2012 |
|---|---|---|
| KR | 10-2012-0133961 A | 12/2012 |

\* cited by examiner

LIGHT EXTRACTION SUBSTRATE FOR ORGANIC LIGHT-EMITTING ELEMENT, METHOD FOR MANUFACTURING SAME AND ORGANIC LIGHT-EMITTING ELEMENT INCLUDING SAME

CROSS REFERENCE TO RELATED APPLICATIONS

The present application is a national phase entry under 35 U.S.C. §371 of International Application No. PCT/KR2014/005910, filed Jul. 2, 2014, which claims priority from Korean Application No. 10-2013-0077784, filed Jul. 3, 2013, all of which are incorporated herein by reference.

BACKGROUND OF THE INVENTION

Field of the Invention

The present invention relates to a light extraction substrate for an organic light-emitting device, a method of fabricating the same and an organic light-emitting device including the same, and more particularly, to a light extraction substrate for an organic light-emitting device which can overcome a problem that light extraction is caused mainly in a specific wavelength range in a conventional photonic crystal pattern having a periodic structure and can cause light extraction in a wider wavelength range, a method of fabricating the same and an organic light-emitting device including the same.

Description of Related Art

In general, an organic light-emitting diode (OLED) includes an anode, a light-emitting layer and a cathode. When a voltage is applied between the anode and the cathode, holes are injected from the anode into a hole injection layer and then migrate from the hole injection layer through a hole transport layer to the organic light-emitting layer, and electrons are injected from the cathode into an electron injection layer and then migrate from the electron injection layer through an electron transport layer to the light-emitting layer. Holes and electrons that are injected into the light-emitting layer recombine with each other in the light-emitting layer, thereby generating excitons. When such excitons transit from the excited state to the ground state, light is emitted.

Organic light-emitting devices including an OLED are divided into a passive matrix type and an active matrix type depending on the mechanism that drives the N*M number of pixels which are arranged in the shape of a matrix.

In an active matrix type, a pixel electrode which defines a light-emitting area and a unit pixel driving circuit which applies a current or voltage to the pixel electrode are positioned in a unit pixel area. The unit pixel driving circuit has at least two thin-film transistors (TFTs) and one capacitor. Due to this configuration, the unit pixel driving circuit can supply a constant current irrespective of the number of pixels, thereby realizing uniform luminance. The active matrix type organic light-emitting display consumes little power, and thus can be advantageously applied to high definition displays and large displays.

However, as shown in FIG. 5, only about 20% of light generated by an OLED is emitted to the outside and about 80% of the light is lost by a waveguide effect originating from the difference in the refractive index between a glass substrate 10 and an anode 20, and an organic light-emitting layer 30 which includes a hole injection layer and a hole transport layer 31, an emissive layer 32, and an electron transport layer and an electron injection layer 33 and by a total internal reflection originating from the difference in the refractive index between the glass substrate 10 and the air. Specifically, the refractive index of the internal organic light-emitting layer 30 ranges from 1.7 to 1.8, whereas the refractive index of indium tin oxide (ITO) which is generally used for the anode 20 ranges from 1.8 to 1.9. Since the two layers have a very small thickness ranging from 200 to 400 nm and the refractive index of glass used for the glass substrate 10 is about 1.5, a planar waveguide is thereby caused inside the organic light-emitting device. It is calculated that the ratio of the light lost in the internal waveguide mode due to the above-described reason is about 45%. In addition, since the refractive index of the glass substrate 10 is about 1.5 and the refractive index of the ambient air is 1.0, when the light is directed outward from the inside of the glass substrate 10, a ray of the light having an angle of incidence greater than a critical angle is totally reflected and is trapped inside the glass substrate 10. Since the ratio of the trapped light is up to about 35%, only about 20% of the generated light is emitted to the outside.

In order to improve the luminous efficiency of an organic light-emitting device, a variety of conventional light extraction approaches was proposed. One of these light extraction approaches employs a photonic crystal structure that has a periodic pattern to extract light, the periodic pattern being formed at the front side of the organic light-emitting device through which light from the OLED is emitted. The size and period of the photonic crystal structure depend on a wavelength, and thus improvement in light extraction is limited to a specific wavelength range. The photonic crystal structure causes a phenomenon in which the peak of one wavelength in a specific wavelength range is higher than that of other wavelengths or the wavelength peak is shifted. Accordingly, the conventional photonic crystal structure is not applicable to white organic light-emitting devices for lighting application, the uniform luminous intensity of which must be obtained in a wide wavelength range.

The information disclosed in the Background of the Invention section is provided only for better understanding of the background of the invention and should not be taken as an acknowledgment or any form of suggestion that this information forms a prior art that would already be known to a person skilled in the art.

BRIEF SUMMARY OF THE INVENTION

Various aspects of the present invention provide an organic light-emitting device which can overcome a problem that light extraction depends on a wavelength range in a conventional photonic crystal pattern having a periodic structure and can cause light extraction in a wider wavelength range, a method of fabricating the same and an organic light-emitting device including the same.

In an aspect of the present invention, provided is a light extraction substrate disposed on one surface of an OLED through which light from the OLED is emitted. The light extraction substrate includes: a base substrate; a photonic crystal pattern disposed on the base substrate; and a planarization layer disposed on the photonic crystal pattern, one surface of the planarization layer adjoining the OLED. A number of air voids having random (various) shapes and sizes are irregularly distributed between the photonic crystal and the planarization layer.

According to an embodiment of the present invention, the photonic crystal may include: a base section disposed on the base substrate; and an embossed section disposed integrally on an upper portion of the base section.

The thickness of the base section may range from 820 to 880 nm.

The thickness of raised parts of the embossed section may range from 270 to 320 nm.

The total thickness of the embossed section and the planarization layer may range from 800 to 830 nm.

The number of air voids may be disposed between the planarization layer and depressed parts of the embossed section.

The photonic crystal pattern may be made of a resin.

The planarization layer may be made of a material, the refractive index of which is higher than the refractive index of the photonic crystal pattern.

In another aspect of the present invention, provided is a method of fabricating a light extraction substrate which is disposed on one surface of an OLED through which light from the OLED is emitted. The method includes the following steps of: forming a photonic crystal pattern on a base substrate; and forming a planarization layer on the photonic crystal pattern by a process resulting in thermal effect, leaving a number of air voids between the photonic crystal pattern and the planarization layer, the number of air voids having random (various) shapes and being irregularly distributed.

According to an embodiment of the present invention, the step of forming the photonic crystal pattern may include forming the photonic crystal pattern of a resin.

The step of forming the photonic crystal pattern may include forming the photonic crystal pattern by nanoimprint lithography.

The refractive index of the material that forms the planarization layer at the step of forming the planarization layer may be higher than the refractive index of the photonic crystal pattern.

The step of forming the planarization layer may include forming the planarization layer by an electron beam (E-beam) process.

In a further aspect of the present invention, provided is an organic light-emitting device that includes the above-described light extraction substrate on one surface of an OLED through which light from the OLED is emitted.

According to an embodiment of the present invention, the organic light-emitting device may be a white light-emitting device for lighting application.

In the light extraction substrate according to embodiments of the present invention in which the photonic crystal pattern having a periodic structure and the planarization layer are disposed at the front side of the OLED through which light from the OLED is emitted to form a light extraction layer in order to improve the light extraction efficiency of the organic light-emitting device, the number of air voids having random (various) shapes are irregularly distributed between the photonic crystal pattern and the planarization layer in order to reduce the periodicity or regularity of the photonic crystal pattern. It is therefore possible to overcome a problem that light extraction is caused mainly in a wavelength range in the photonic crystal pattern having a periodic structure and to cause light extraction in a wider wavelength range. Accordingly, the light extraction substrate can be applied as an internal light extraction substrate of a white organic light-emitting device for lighting application.

The methods and apparatuses of the present invention have other features and advantages which will be apparent from, or are set forth in greater detail in the accompanying drawings, which are incorporated herein, and in the following Detailed Description of the Invention, which together serve to explain certain principles of the present invention.

DETAILED DESCRIPTION OF THE INVENTION

Figure 1:
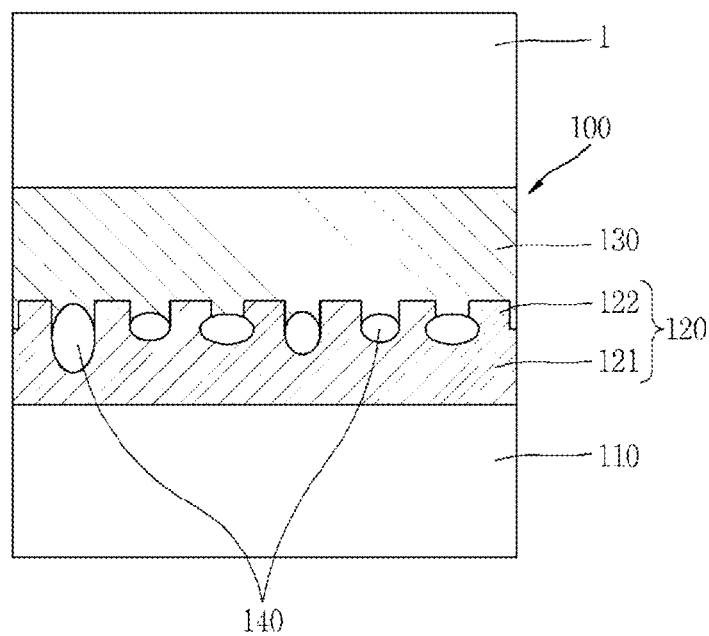
FIG. 1 is a cross-sectional view schematically showing an organic light-emitting device which has a light extraction substrate according to one exemplary embodiment of the present invention as an internal light extraction substrate of an organic light-emitting device.

Reference will now be made in detail to a light extraction substrate for a light-emitting device, a method of fabricating the same and an organic light-emitting device including the same according to the present invention, embodiments of which are illustrated in the accompanying drawings and described below, so that a person skilled in the art to which the present invention relates can easily put the present invention into practice.

Throughout this document, reference should be made to the drawings, in which the same reference numerals and signs are used throughout the different drawings to designate the same or similar components. In the following description of the present invention, detailed descriptions of known functions and components incorporated herein will be omitted when they may make the subject matter of the present invention unclear.

As shown in FIG. 1, an organic light-emitting device according to this exemplary embodiment includes an OLED 1 and a light extraction substrate 100 which is disposed on one surface of the OLED 1 through which light from the OLED 1 is emitted in order to improve the light extraction efficiency of the OLED 1.

Although not shown in detail, the OLED 1 has a multilayer structure in which an anode, an organic light-emitting layer and a cathode are sandwiched between the light extraction substrate 100 and a substrate that faces the light extraction substrate 100. Here, the anode can be made of a metal or metal oxide, for example, Au, In, Sn or indium tin oxide (ITO), which has a significant work function in order to facilitate the hole injection. The cathode can be made of a metal thin film of, for example, Al, Al:Li or Mg:Ag, which has a smaller work function in order to facilitate the electron injection. When the organic light-emitting device is a top emission type organic light-emitting device, the cathode can have a multilayer structure that includes a semitransparent electrode of a metal thin film made of Al, Al:Li or Mg:Ag and a transparent electrode of an oxide thin film made of, for example, ITO, in order to facilitate the transmission of light that is generated from the organic light-emitting layer. The organic light-emitting layer includes a hole injection layer, a hole transport layer, an emissive layer, an electron transport layer and an electron injection layer which are sequentially stacked on the anode. Since the organic light-emitting device according to this exemplary embodiment is implemented as a white organic light-emitting device for lighting application, for example, the light-emitting layer can have a multilayer structure that includes a high-molecular light-emitting layer which emits blue light and a low-molecular light-emitting layer which emits orange-red light. The light-emitting layer can also have a variety of other structures to emit white light.

With this structure, when a forward voltage is induced between the anode and the cathode, electrons from the cathode migrate to the emissive layer through the electron injection layer and the electron transport layer, and holes from the anode migrate to the emissive layer through the hole injection layer and the hole transport layer. The electrons and holes that have migrated into the emissive layer recombine with each other, thereby generating excitons. When these excitons transit from an excited state to a ground state, light is emitted. The brightness of the light emitted is proportional to the amount of current that flows between the anode and the cathode.

The light extraction substrate 100 for an organic light-emitting device according to this exemplary embodiment includes a base substrate 110, a photonic crystal pattern 120 and a planarization layer 130.

The base substrate 110 is the substrate that supports the photonic crystal pattern 120 and the planarization layer 130 which are disposed on one surface thereof. The base substrate 110 is also disposed on the front side of the OLED 1, i.e. in the direction in which light from the OLED 1 is emitted, and serves as an encapsulation substrate which allows the generated light to exit through while protecting the OLED 1 from the external environment.

The base substrate 110 can be a transparent substrate that has superior light transmittance and mechanical properties. For instance, the base substrate 110 can be made of a polymeric material, such as a thermally or ultraviolet (UV) curable organic film, or a chemically strengthened glass, such as soda-lime glass ($SiO_2$—CaO—$Na_2O$) or aluminosilicate glass ($SiO_2$—$Al_2O_3$—$Na_2O$). When the organic light-emitting device including the OLED 1 and the light extraction substrate 100 according to this exemplary embodiment is applied for lighting, the base substrate 110 can be made of soda-lime glass. The base substrate 110 can also be a substrate that is made of a metal oxide or a metal nitride. The base substrate 110 can be made of a piece of thin glass having a thickness of 1.5 mm or less. The thin glass can be made using a fusion process or a floating process.

Figure 3:
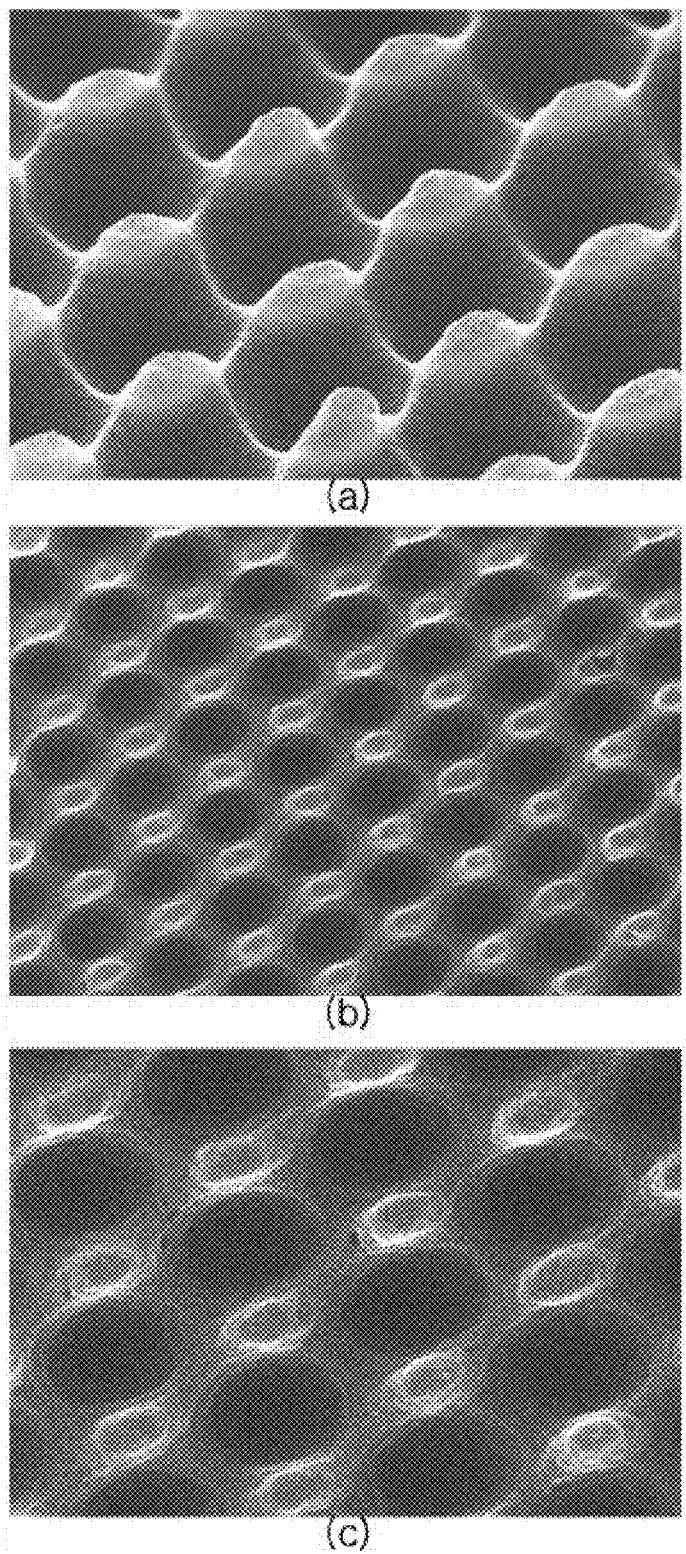
FIG. 3 is electron microscopy pictures showing the surface of a photonic crystal pattern of a light extraction substrate for an organic light-emitting device according to an exemplary embodiment of the present invention.

The photonic crystal pattern 120 serves to diversify or increase paths along which light generated from the OLED 1 scatters, thereby improving the light extraction efficiency of the organic light-emitting device. The photonic crystal pattern 120 is disposed on the base substrate 110. The photonic crystal pattern 120 includes a base section 121 and an embossed section 122. The base section 121 is disposed on the base substrate 110, and the embossed section 122 is formed integrally on the upper portion of the base section 121. As shown in the electron microscopy pictures of FIG. 3, the embossed section 122 can have a periodic structure. According to this exemplary embodiment, the thickness of the base section 121 may range from 820 to 880 nm, and the thickness of the raised parts of the embossed section 122 may range from 270 to 320 nm.

The photonic crystal pattern 120 having this structure can be made of a material, for example, a resin, the refractive index of which is lower than that of the planarization layer 130. The photonic crystal pattern 120 can be formed by nanoimprint lithography (NIL), which will be described in greater detail later in relation to a method of fabricating a light extraction substrate for an organic light-emitting device.

The planarization layer 130 is disposed on the photonic crystal pattern 120. The planarization layer 130 forms, together with the photonic crystal pattern 120, an internal light extraction layer of the organic light-emitting device. Here, the surface of the planarization layer 130 disposed on the photonic crystal pattern 120 adjoins the OLED 1, more particularly, the anode of the OLED 1. As the surface of the planarization layer 130 adjoins the OLED 1 in this manner, the surface of the planarization layer 130 must have a high level of flatness in order to prevent the electrical characteristics of the organic light-emitting device from being deteriorated. When the planarization layer 130 is formed on the photonic crystal pattern 120, the embossed section 122 of the photonic crystal pattern 120 may make the surface of the planarization layer 130 embossed. In order to prevent this, the planarization layer 130 is required to be sufficiently thick. For instance, when the thickness of the raised parts of the embossed section 122 ranges from 270 to 320 nm, the total thickness of the embossed section and the planarization layer 130 preferably ranges from 800 to 830 nm.

Figure 4:
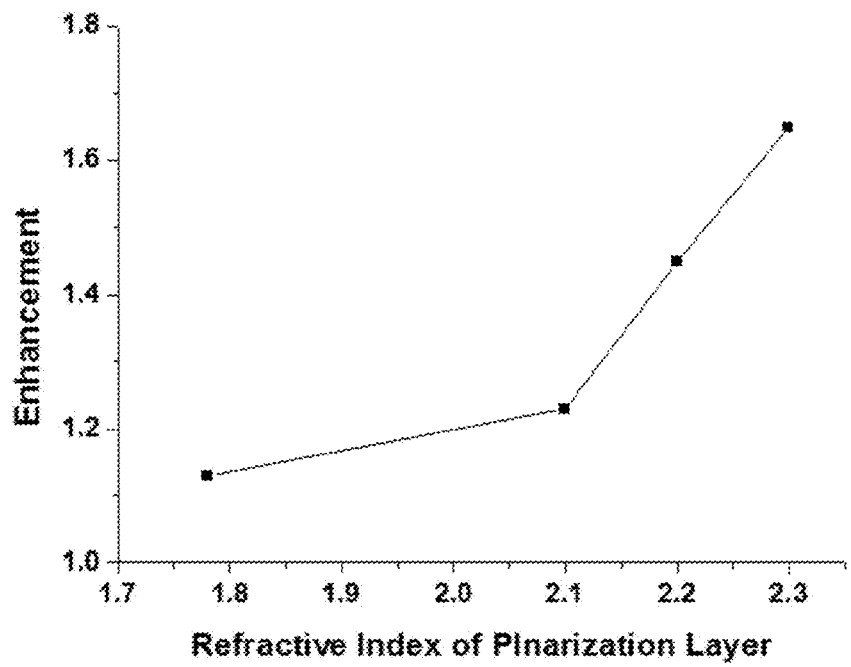
FIG. 4 is a graph showing variations in luminous intensity depending on the refractive index of a planarization layer of a light extraction substrate for an organic light-emitting device according to an exemplary embodiment of the present invention.
Figure 5:
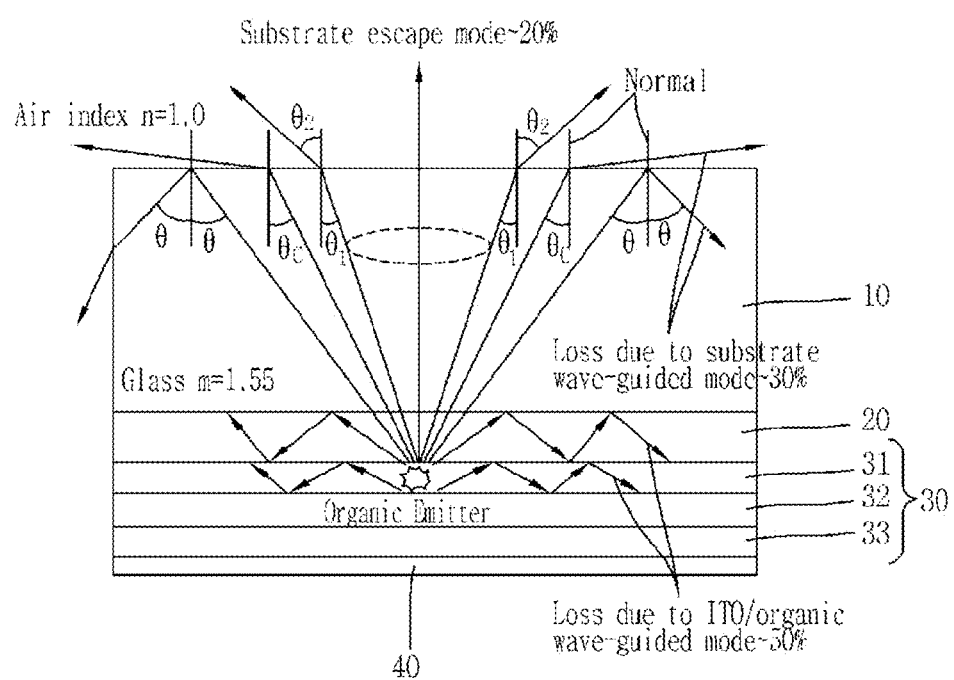
FIG. 5 is a conceptual cross-sectional view of a conventional organic light-emitting device for explaining the light extraction efficiency thereof.

In addition, in order to prevent cracks, the planarization layer 130 can be made of a material, the coefficient of thermal expansion (CTE) of which is similar to that of a resin that is to form the photonic crystal pattern 120. The planarization layer 130 can be made of a material, the refractive index of which is higher than that of the photonic crystal pattern 120. The graph in FIG. 4 indicates that the luminous intensity increases with the increasing refractive index of the planarization layer 130. It is therefore preferred that the planarization layer 130 be made of a material, the refractive index of which is higher than that of the photonic crystal pattern 120, more particularly, a material, the refractive index n of which is 2.1 or greater. For instance, the planarization layer 130 can be made of a metal oxide, such as $TiO_2$, $SnO_2$, $Al_2O_3$ or ZnO, or a metal nitride, such as $SiN_x$.

Figure 2:
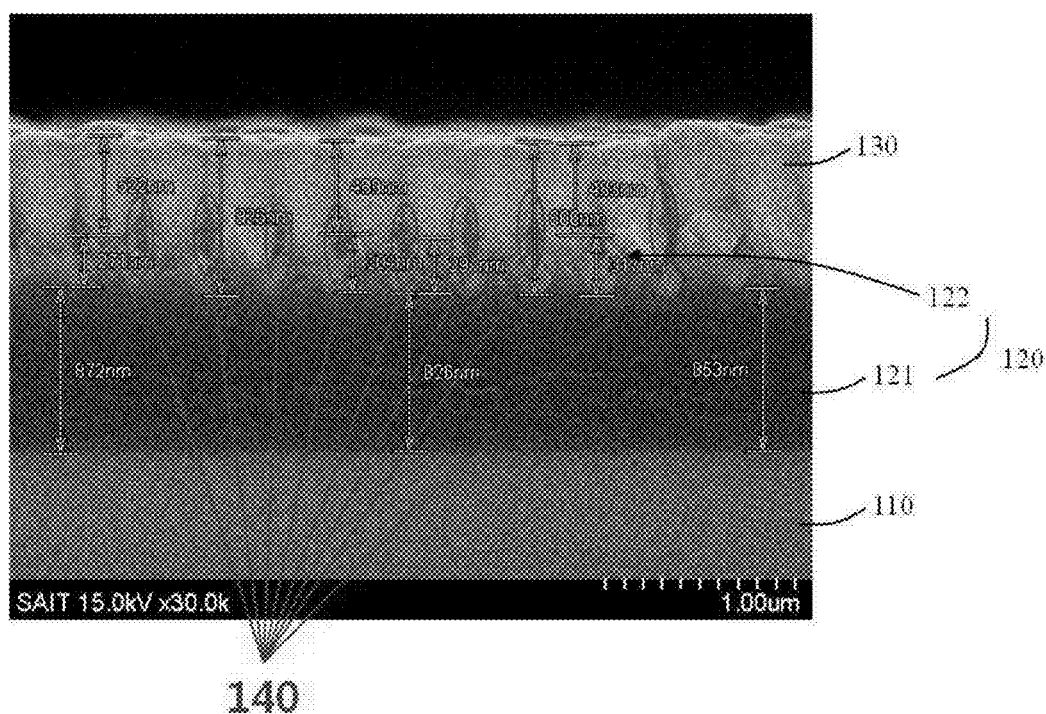
FIG. 2 is an electron microscopy picture showing the cross-section of a light extraction substrate for an organic light-emitting device according to an exemplary embodiment of the present invention.

As shown in FIG. 1 and FIG. 2, a number of air voids 140 having random shapes and sizes are irregularly distributed between the photonic crystal pattern 120 and the planarization layer 130 which are stacked on each other. The number of air voids 140 may be concentrated mainly in the depressed parts of the embossed section 122 of the photonic crystal pattern 120 which tend to be left vacant when the planarization layer 130 is formed.

When the organic light-emitting device according to this exemplary embodiment is a white organic light-emitting device for lighting application, light extraction must be caused in a wide wavelength range. However, since the photonic crystal pattern 120 tends to have a periodic structure which significantly increases light extraction in a specific wavelength range, the requirement for the white organic light-emitting device for lighting application, i.e. light extraction in a wide wavelength range, is not achieved. In this case, the number of air voids 140 serve to reduce the periodicity or regularity of the photonic crystal pattern 120. The number of air voids 140 formed between the photonic crystal pattern 120 and the planarization layer 130 also function like a number of light-scattering particles to scatter light along diverse paths, thereby causing light extraction in a wide wavelength range suitable to the white organic light-emitting device for lighting application. The characteristic of the number of air voids 140 may be adjusted by the moisture content of the material that forms the photonic crystal pattern 120 and the method of forming the planarization layer 130. This will be described in greater detail later in relation to the method of fabricating a light extraction substrate for an organic light-emitting device.

A description will be given below of the method of fabricating a light extraction substrate for an organic light-emitting device according to an exemplary embodiment of the present invention. Reference numerals for the components of the light extraction substrate will refer to those in FIG. 1.

The method of fabricating a light extraction substrate for an organic light-emitting device according to this exemplary embodiment is the method of fabricating the light extraction substrate 100 which is disposed on one surface of the OLED 1 through which light from the OLED 1 is emitted. The method includes a photonic crystal patterning step and a planarization layer forming step.

The photonic crystal patterning step is the step of forming the photonic crystal pattern 120 having a periodic structure on the base substrate 110. At the photonic crystal patterning step, the photonic crystal pattern 120 can be made of a resin. In addition, the photonic crystal patterning step can form the photonic crystal pattern 120 by a nano imprint lithography (NIL) process. Specifically, the resin is applied on the base substrate 110, is pressed using a nano-patterned template, and then is exposed to ultraviolet (UV) radiation. Afterwards, the template is removed from the cured resin, thereby leaving the photonic crystal pattern 120 made of the resin on the base substrate 110. The photonic crystal pattern 120 formed by the NIL process includes the base section 121 and the embossed section 122. According to this exemplary embodiment, the photonic crystal patterning step can control the NIL process such that the thickness of the base section 121 ranges from 820 to 880 nm and the thickness of the raised parts of the embossed section 122 ranges from 270 to 320 nm.

Afterwards, the planarization layer forming step is the step of forming the planarization layer 130 on the photonic crystal pattern 120. According to this exemplary embodiment, the number of air voids 140 which have random shapes and sizes and are irregularly distributed are formed between the photonic crystal pattern 120 and the planarization layer 130. The number of air voids 140 reduce the periodicity of the photonic crystal pattern 120 that has a periodic structure, thereby causing light extraction in a wider wavelength range rather than in a specific wavelength range. For this, at the planarization layer forming step, the planarization layer 130 is made of a material, for example, $TiO_2$, the refractive index of which is higher than that of the photonic crystal pattern 120. The number of air voids 140 can be formed using the moisture in the resin that forms the photonic crystal pattern 120. Specifically, at the planarization layer forming step, the photonic crystal pattern 120 can be coated with the planarization layer 130 by a process resulting in thermal effect, such as an electron beam (E-beam) process. In this case, due to the evaporation of the moisture from the resin and the repulsive force of $TiO_2$, the material that forms the planarization layer 130, a number of small regions in the photonic crystal pattern 120 is left (at least partially) vacant without being filled up with $TiO_2$, thereby forming the number of air voids 140. Due to the structure of the photonic crystal pattern 120, the number of air voids 140 can be concentrated in the depressed parts of the embossed section 122. When the number of air voids 140 is formed or caused through the thermal interaction between the material that forms the photonic crystal pattern 120 and the material that forms the planarization layer 130 in this manner, the number of air voids 140 have random shapes and sizes and are irregularly distributed between the photonic crystal pattern 120 and the planarization layer 130. The number of air voids 140 serve to destroy the periodicity of the photonic crystal pattern 120 having a periodic structure while scattering light generated from the OLED 1 along a variety of paths.

The surface of the planarization layer 130 formed on the photonic crystal pattern 120 at the planarization layer forming step must have a high level of flatness since the planarization layer 130 adjoins the anode of the OLED 1. Therefore, at the planarization layer forming step, the planarization layer 130 is preferably formed as a thick film in order to prevent the shape of the embossed section 122 of the photonic crystal pattern 120 from being exposed on the surface of the planarization layer 130, i.e. to prevent the embossed section 122 from causing an embossed surface of the planarization layer 130. For instance, at the planarization layer forming step, the planarization layer 130 can be formed such that a total thickness of the embossed section and the planarization layer ranges from 800 to 830 nm when the thickness of the raised parts of the embossed section 122 ranges from 270 to 320 nm.

At the completion of the planarization layer forming step in this manner, the light extraction substrate 100 applicable for an internal light extraction substrate of the white organic light-emitting device for lighting application is fabricated.

As set forth above, the photonic crystal pattern 120 is formed from the resin that contains moisture by the NIL process, and then the planarization layer 130 is formed of a material that requires a thermal process. It is therefore possible to cause the number of air voids 140 to be formed between the photonic crystal pattern 120 and the planarization layer 130 such that the number of air voids 140 have random shapes and sizes and are irregularly distributed. This can consequently overcome light extraction dependency in a wavelength range that occurs in the photonic crystal pattern 120 having a periodic structure, and can cause light extraction in a wider wavelength range. Accordingly, the light extraction substrate 100 can be used as an internal light extraction substrate of the white organic light-emitting device for lighting application.

The foregoing descriptions of specific exemplary embodiments of the present invention have been presented with respect to the drawings. They are not intended to be exhaustive or to limit the present invention to the precise forms disclosed, and obviously many modifications and variations are possible for a person having ordinary skill in the art in light of the above teachings.

It is intended therefore that the scope of the present invention not be limited to the foregoing embodiments, but be defined by the Claims appended hereto and their equivalents.

What is claimed is:

1. A light extraction substrate disposed on one surface of an organic light-emitting diode through which light from the organic light-emitting diode is emitted, comprising:
    a base substrate;
    a photonic crystal pattern disposed on the base substrate; and
    a planarization layer disposed on the photonic crystal pattern, one surface of the planarization layer adjoining an organic light-emitting diode, wherein a number of air voids having random shapes and sizes are irregularly distributed between the photonic crystal and the planarization layer.

2. An organic light-emitting device comprising the light extraction substrate as recited in claim 1.

3. The light extraction substrate according to claim 1, wherein the photonic crystal comprises:
a base section disposed on the base substrate; and
an embossed section disposed integrally on an upper portion of the base section.

4. The light extraction substrate according to claim 3, wherein a thickness of the base section ranges from 820 to 880 nm.

5. The light extraction substrate according to claim 4, wherein a thickness of raised parts of the embossed section ranges from 270 to 320 nm.

6. The light extraction substrate according to claim 5, wherein a total thickness of the embossed section and the planarization layer ranges from 800 to 830 nm.

7. The light extraction substrate according to claim 6, wherein the number of air voids is disposed between the planarization layer and depressed parts of the embossed section.

8. The light extraction substrate according to claim 1, wherein the photonic crystal pattern comprises a resin.

9. The light extraction substrate according to claim 8, wherein the planarization layer comprises a material which has a higher refractive index than the photonic crystal pattern.

10. A method of fabricating a light extraction substrate which is disposed on one surface of an organic light-emitting diode through which light from the organic light-emitting diode is emitted, the method comprising:
forming a photonic crystal pattern on a base substrate; and
forming a planarization layer on the photonic crystal pattern by a process resulting in thermal effect, leaving a number of air voids between the photonic crystal pattern and the planarization layer, the number of air voids having random shapes and being irregularly distributed.

11. The method according to claim 10, wherein the photonic crystal pattern comprises a resin.

12. The method according to claim 10, wherein forming the photonic crystal pattern comprises forming the photonic crystal pattern by nanoimprint lithography.

13. The method according to claim 10, wherein a refractive index of the planarization layer is higher than a refractive index of the photonic crystal pattern.

14. The method according to claim 10, wherein the process resulting in thermal effect comprises an electron beam process.

15. The organic light-emitting device according to claim 2, wherein the organic light-emitting device comprises a white light-emitting device for lighting application.

* * * * *